(12) United States Patent
Meynants et al.

(10) Patent No.: US 9,893,117 B2
(45) Date of Patent: Feb. 13, 2018

(54) PIXEL STRUCTURE

(71) Applicant: CMOSIS BVBA, Antwerp (BE)

(72) Inventors: Guy Meynants, Retie (BE); Koen Van Wichelen, Heverlee (BE)

(73) Assignee: CMOSIS BVBA, Antwerp (BE)

( * ) Notice: Subject to any disclaimer, the term of this patent is extended or adjusted under 35 U.S.C. 154(b) by 600 days.

(21) Appl. No.: 14/180,170

(22) Filed: Feb. 13, 2014

(65) Prior Publication Data

US 2014/0231879 A1   Aug. 21, 2014

(30) Foreign Application Priority Data

Feb. 15, 2013   (GB) .................................. 1302664.6

(51) Int. Cl.
*H01L 27/148* (2006.01)
*H01L 27/146* (2006.01)

(52) U.S. Cl.
CPC .... *H01L 27/14887* (2013.01); *H01L 27/1463* (2013.01); *H01L 27/14616* (2013.01); *H01L 27/14623* (2013.01)

(58) Field of Classification Search
CPC ........ H01L 27/14887; H01L 27/14616; H01L 27/1463
See application file for complete search history.

(56) References Cited

U.S. PATENT DOCUMENTS

| | | | |
|---|---|---|---|
| 6,225,670 B1 | 5/2001 | Dierickx | |
| 7,271,835 B2 | 9/2007 | Iizuka et al. | |
| 7,385,270 B2 | 6/2008 | Ihara | |
| 7,605,440 B2 | 10/2009 | Altice | |
| 7,687,832 B2 | 3/2010 | Patrick et al. | |
| 8,283,195 B2 | 10/2012 | Meynants | ........................ 438/57 |
| 8,314,376 B2 | 11/2012 | Watanabe | |
| 8,344,376 B2 | 1/2013 | Chen | .............................. 257/48 |

(Continued)

FOREIGN PATENT DOCUMENTS

| | | |
|---|---|---|
| EP | 2 109 306 A2 | 3/2009 |
| EP | 2075843 A2 | 7/2009 |
| EP | 2 346 079 A1 | 12/2010 |

OTHER PUBLICATIONS

Stefan. Lauxtermann et al., "Comparison of Global Shutter Pixels for CMOS Image Sensors", pp. 82-85.

(Continued)

*Primary Examiner* — Errol Fernandes
(74) *Attorney, Agent, or Firm* — Stein IP, LLC

(57) ABSTRACT

A pixel structure comprises an epitaxial layer (1) of a first conductivity type. A photo-sensitive element comprises a first region (4) of a second conductivity type and a second region (3) of the first conductivity type positioned between the epitaxial layer (1) and the first region (4). A charge storage node (ø2) is arranged to store charges acquired by the photo-sensitive element, or to form part of a charge storage element. A third region (2) of the second conductivity type is positioned between the charge storage node and the epitaxial layer. The pixel structure further comprises a charge-to-voltage conversion element (13) for converting charges from the charge storage node to a voltage signal and an output circuit (21, 22) for selectively outputting the voltage signal from the pixel structure.

21 Claims, 13 Drawing Sheets

(56) References Cited

U.S. PATENT DOCUMENTS

| | | |
|---|---|---|
| 2007/0045668 A1* | 3/2007 | Brady ............... H01L 27/14603 257/219 |
| 2007/0109437 A1 | 5/2007 | Funaki et al. |
| 2009/0224351 A1* | 9/2009 | Hsieh ............... H01L 27/14609 257/444 |
| 2009/0256176 A1 | 10/2009 | Kobayashi et al. .......... 257/225 |
| 2010/0102366 A1 | 4/2010 | Sharp |
| 2010/0194936 A1 | 8/2010 | Kanabe |
| 2011/0019038 A1 | 1/2011 | Okuno |
| 2011/0084316 A1 | 4/2011 | Yamashita et al. ........... 257/226 |
| 2012/0002089 A1 | 1/2012 | Wang et al. .................. 348/297 |
| 2012/0080726 A1* | 4/2012 | Sakano ............... H01L 27/1461 257/225 |
| 2012/0153125 A1 | 6/2012 | Sony |
| 2012/0273654 A1 | 11/2012 | Hynecek et al. |
| 2012/0273854 A1 | 11/2012 | Velicko et al. |

OTHER PUBLICATIONS

International Image Sensor Workshop 2007, Ogunquit, Me., Jun. 6-10, 2007 (available on www.imagesensors.org).
Hyung-Jun. Yoon, et al, "A CMOS Image Sensor With In-Pixel Two-Stage Charge Transfer for Fluorescence Lifetime Imaging", IEEE trans. El. Dev, vol. 56, No. 2, Feb. 2009, 214-221.

* cited by examiner

PIXEL STRUCTURE

RELATED APPLICATION

This application claims the benefit of priority of the filing date of British Patent Application 1302664.6 filed on Feb. 15, 2013, which is incorporated herein by reference.

TECHNICAL FIELD

This invention relates to pixel structures and to arrays of pixel structures which can be used in applications such as image sensors.

BACKGROUND

An image sensor comprises an array of pixel structures. The array can be operated with a rolling shutter or with a global shutter. For a rolling shutter, image acquisition is briefly shifted in time for every row of the pixel array. This leads to deformation of the scene. For a global shutter, all pixels are exposed together (synchronously). A global shutter is required to record fast moving subjects, or when the camera itself is moving. This is typically needed in high speed imaging applications or in machine vision. A global shutter pixel requires a memory element inside the pixel array, to store the captured image during the frame readout time. This stored pixel sample is then read out row-by-row while the next image is captured.

In some known global shutter pixel configurations, charges are stored in a potential well, in the charge domain. This charge storage node can unintentionally collect additional photoelectrons during a charge storage phase of operation. These additional photoelectrons are intended to be collected by the photodiode rather than by the storage node, but some charges will diffuse and be collected by the storage node instead. This results in a parasitic light sensitivity of the charge storage nodes.

FIG. 1 shows a global shutter pixel with in-pixel charge storage under a storage gate ø2. A cross-section is shown of the photodiode, charge transfer gates ø1, ø2 and ø3, the floating diffusion fd, the reset transistor RST, and the anti-blooming charge drain AB. The source follower and select transistor are shown on circuit level only. The photodiode is a pinned photodiode in which the surface is pinned at ground potential by a p+ surface implant layer. This p+ implant layer is connected to ground potential (not shown in the drawing). The diode itself is formed by an n-type implant under this pinning implant, which forms a junction with the p+ surface implant and the p-epitaxial layer. Charges are transferred from the photodiode to the storage gate ø2 via the transfer gate ø1 at the end of the exposure time. For readout, the floating diffusion fd is reset through RST, and then the charge is transferred from ø2 to fd by pulsing gates ø2 and ø3.

After the signal has been sampled under ø2, and while the signal is stored under ø2, the next image is acquired. Photo-generated electrons are created in the substrate. The electrons generated in the p-epitaxial layer are to be collected by the photodiode. Some are generated inside the depleted area of the photodiode and are immediately collected. Other charges are generated outside of this depletion area and will diffuse until they reach the electric field formed by the photodiode or by another junction or gate in the structure. Two such electrons e− are shown. One electron diffuses and is collected by the photodiode. Another electron however diffuses until it is collected by the storage gate ø2, which is biased at a high potential during storage. There is no electrical barrier for this electron to diffuse to this gate. A significant fraction of electrons are collected by this storage gate. A light shield 11 can be used to shield the storage node. This is only partially effective due to the random diffusion of the electrons.

FIG. 2 shows a known improvement intended to avoid charge diffusion to the storage nodes. This improvement is described, for example, in U.S. Pat. No. 6,225,670, provides a higher p dose under the storage node. The concentration difference between the p-well layer and p-epitaxial layer is sufficient to create a small potential barrier. The potential difference is given by:

$$\phi = \frac{kT}{q} \ln\left(\frac{N_a^+}{N_a}\right)$$

where Na and Na+ are the acceptor concentrations for the p and p+ regions, and kT/q is the thermal voltage (k=Boltzman constant, T=absolute temperature, q=elementary charge). Typical p-well concentrations are 1E17/cm3, while typical epitaxial layer concentrations are 5e14/cm3, forming a barrier of 134 mV at room temperature. FIG. 3 shows the electrostatic potential along the cross-sections A-A', B-B' and C-C' in FIGS. 1 and 2. Another example of the use of a dopant profile to shield unrelated junctions in the pixel from charge collection is shown in US Patent application US 2007/0109437A1.

The present invention seeks a way to further improve shutter efficiency by reducing the parasitic light sensitivity of the pixel structure.

SUMMARY

An aspect of the invention provides a pixel structure comprising:
an epitaxial layer of a first conductivity type;
a photo-sensitive element comprising a first region of a second conductivity type and a second region of the first conductivity type positioned between the epitaxial layer and the first region;
a charge storage node which is arranged to store charges acquired by the photo-sensitive element, or to form part of a charge storage element;
a third region of the second conductivity type positioned between the charge storage node and the epitaxial layer;
a charge-to-voltage conversion element for converting charges from the charge storage node to a voltage signal; and,
an output circuit for selectively outputting the voltage signal from the pixel structure.

Advantageously, the first conductivity type is n-type and the second conductivity type is p-type.

Advantageously, the photo-sensitive element is a pinned photodiode.

Advantageously, a dopant level of the third region is higher than a dopant level of the epitaxial layer. The dopant level of the third region can be higher than a dopant level of the epitaxial layer by a factor of at least 100, or by a factor of between 200 and 1,000.

Advantageously, a dopant level of the second region is higher than a dopant level of the epitaxial layer. The dopant level of the second region can be higher than a dopant level of the epitaxial layer by a factor of at least 100 or by a factor of between 100 and 2,000.

Advantageously, the charge storage node comprises one of: a floating diffusion, a transfer gate, a capacitor plate, a pinned diode.

Advantageously, the charge-to-voltage conversion element is a region of the first conductivity type within the third region.

Advantageously, the charge storage node and the charge-to-voltage conversion element is a region of the first conductivity type within the third region.

Advantageously, the charge storage node is positioned between the photo-sensitive element and the charge-to-voltage conversion element. This is useful for pixel structures where there is in-pixel storage in the charge-domain.

Advantageously, the pixel structure further comprises at least one of: a transfer gate positioned between the photo-sensitive element and the charge storage node; and a transfer gate positioned between the charge storage node and the charge-to-voltage conversion element.

Advantageously, the charge storage node is positioned between the charge-to-voltage conversion element and the output circuit. The charge storage node can form part of a charge storage element and can, for example, be a junction of a switch which connects to a capacitor, or a gate-to-channel capacitance of a transistor which serves as a charge storage element. In this case the charge storage node can also benefit from shielding, even though it is not the main charge storage element.

Advantageously, the third region extends to the first region and the second region of the photo-sensitive element.

Advantageously, the pixel structure further comprises isolation regions of the second conductivity type adjacent a boundary of the pixel structure for preventing lateral diffusion of charges, wherein the isolation regions are located in the epitaxial layer. The isolation regions can extend between the third region and a lower face of the epitaxial layer.

Advantageously, the pixel structure further comprises an anti-blooming gate positioned between the photo-sensitive element and a supply connection.

Advantageously, the pixel structure further comprises one of: a substrate of the second conductivity type; and an implant of the second conductivity type on an opposite face to that where the charge storage node is located.

Advantageously, the pixel structure comprises a front side and a back side, wherein the photo-sensitive element and the charge storage node are positioned adjacent the front side, and the pixel structure further comprises an implant of the second conductivity type adjacent the back side.

Advantageously, another aspect of the invention provides an image sensor comprising an array of the pixel structures.

Advantageously, the image sensor is in the form of a backside illuminated image sensor which is intended to be exposed to light on a face of the sensor which is remote from the charge storage node. The charge storage node can be effectively shielded from light without the use of a backside light shield.

Advantageously, the image sensor further comprises control logic which is arranged to cause the array of the pixel structures to be exposed synchronously. Advantageously, the control logic is arranged to read a voltage signal from the pixel structures in the array for a first exposure period while the pixel structures are exposed for a second exposure period.

Advantageously, the charge storage node can provide in-pixel charge storage and can be used to store one or more signal values over a period of time. This is useful for global shutter operation. A shielding function of the third region can also provide advantages to a type of pixel structure where the charge storage node is the charge-to-voltage conversion element (e.g. a floating diffusion, fd). In this type of pixel structure, charge is (briefly) stored at the charge-to-voltage conversion element during a readout operation. This can provide an advantage that the signal read out from the pixel after a exposure period can have a reduced sensitivity to light during read out and/or can improve the fill factor of the pixel structure by allowing charges which are generated in the epitaxial layer beneath the third region to reach the photo-sensitive element rather than another, undesired, part of the pixel structure.

The pixel array can be manufactured using a technology such as Complementary Metal Oxide Semiconductor (CMOS). Another aspect of the invention provides a method of manufacturing a pixel structure by forming regions and the epitaxial layer of the pixel structure, and to a method of manufacturing an image sensor comprising an array of the pixel structures.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example only, with reference to the accompanying drawings in which.

DETAILED DESCRIPTION OF THE PREFERRED EMBODIMENTS

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 4:
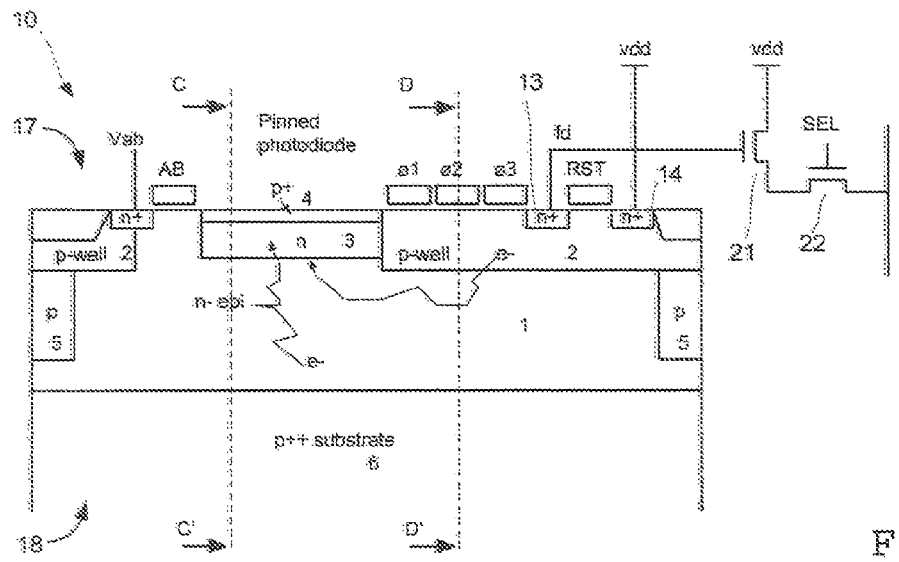
FIG. 4 shows a pixel according to a first embodiment of the present invention, on an n-type epitaxial layer and with a p-type isolation implant under the storage node, and with lateral isolation with a deep p implant.

FIG. 4 shows an embodiment of a pixel structure which can form part of an array of pixels of an image sensor. The pixel generally has a first major (planar) surface 17 which will be called a front side and a second major (planar) surface 18 which will be called a back side. In an image sensor which is intended to be illuminated on the front side 17, there is usually a substrate 6 adjacent the back side. In an image sensor which is intended to be illuminated on the back side 18, the substrate 6 is omitted. The pixel structure comprises an epitaxial layer 1 of a first conductivity type. A pinned photodiode comprises a first region 4 of a second conductivity type adjacent the front side 17 and a second region 3 of the first conductivity type positioned between the epitaxial layer 1 and the first region 4. In FIG. 4 the first conductivity type is n-type and the second conductivity type is p-type. Regions 3, 4 can be formed during manufacture of the image sensor by implant operations. A charge storage node ø2 is provided for storing charge which has been previously acquired by the photodiode. In FIG. 4 the charge storage node comprises a gate ø2 and charge is stored in an inversion layer beneath the gate. The pixel structure further comprises a third region 2 of the second conductivity type positioned between the charge storage node ø2 and the epitaxial layer 1. A charge-to-voltage conversion element 13, called a floating diffusion, fd, is provided for converting charge received from the charge storage node ø2 to a voltage signal. The charge-to-voltage conversion element/floating diffusion fd 13 is a region of the first conductivity type (n+) within the third region 2. An output circuit 21, 22 is provided for selectively outputting the voltage signal from the pixel.

The charge storage node can be used to store charge which has been acquired by the photodiode during an exposure period. In FIG. 4 the charge storage node is the region beneath ø2. In use, charge can be selectively transferred between the photodiode and the charge storage node ø2 by operating gate ø1. Charge can be selectively transferred between the charge storage node ø2 and the floating diffusion (fd) by operating gate ø3. A reset switch is provided for resetting the floating diffusion (fd) to a supply potential vdd.

Figure 1:
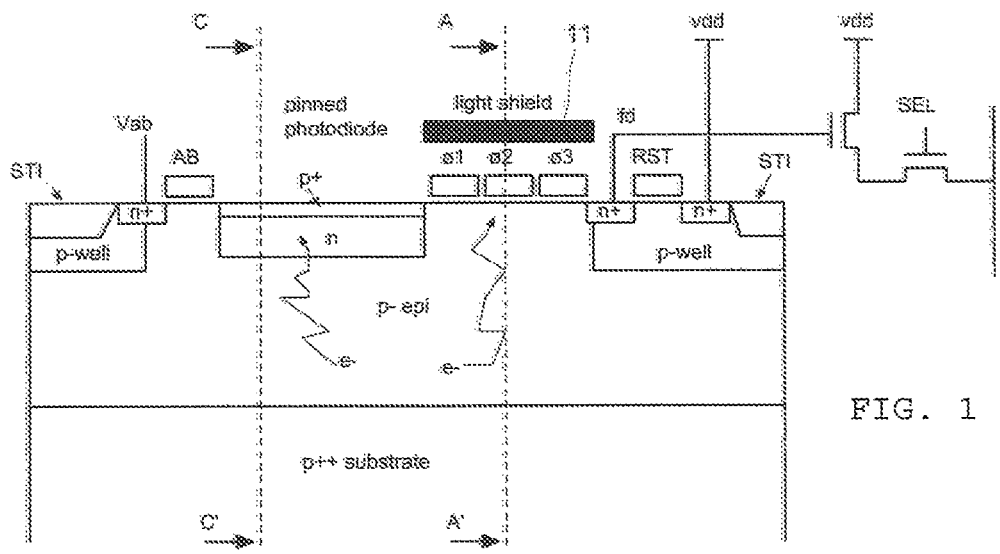
FIG. 1 shows a pixel processed on a p-type epitaxial layer with an 3-phase charge transfer and storage stage for global shutter operation as known in the art.
Figure 2:
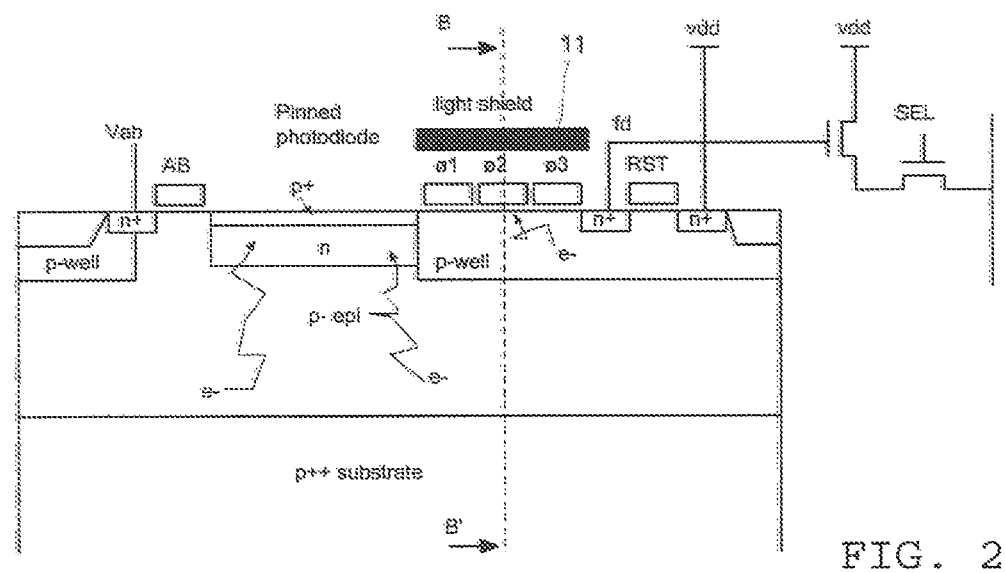
FIG. 2 shows a pixel processed on a p-type epitaxial layer with a 3-phase charge transfer and storage stage which is isolated by a p-type implantation under the storage stage.
Figure 3:
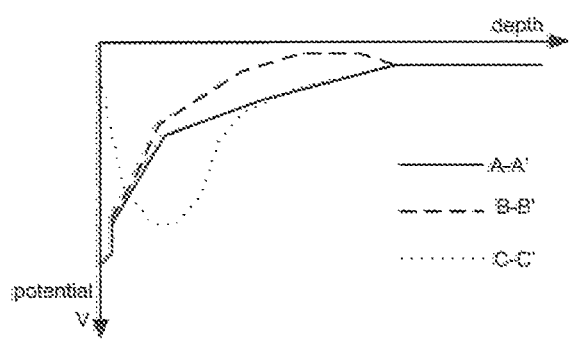
FIG. 3 shows the potential profile across cross-sections A-A', B-B' and C-C' in FIGS. 1 and 2.
Figure 6:
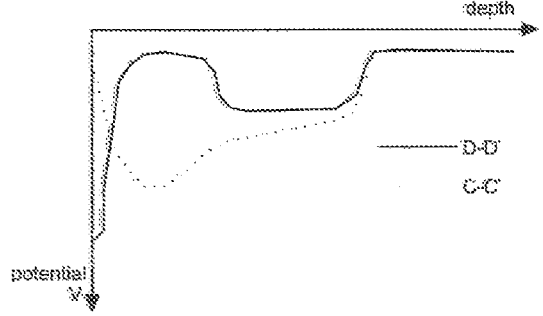
FIG. 6 shows the potential profile along cross-sections C-C' and D-D' in FIG. 4.

The pixel structure of FIG. 4 improves the parasitic light sensitivity by (significantly) increasing the potential barrier by the use of a reverse biased p-n junction. A reverse biased p-n junction is used as a charge barrier between the active n-type detector layer 1 and the storage node ø2. The n-type epitaxial layer 1 serves as an active detector layer. This is the layer in which the photocharges are generated. FIG. 6 shows the potential profile across a vertical cross-section C-C' (through the pinned photodiode) and D-D' (through the storage gate). The cross-section C-C' though the photodiode is similar to that shown previously in FIG. 3. The potential is at its highest in the pinned photodiode. The structure D-D' shows a potential barrier between the active n-epi detector layer 1 and the storage node, formed by the reverse-biased p-well/n-epi junction. The potential across this barrier is considerably higher than in the case of FIG. 2. For an abrupt n/p junction, the potential barrier can be calculated as:

$$\phi = kTqlnN_A N_D nV_{bi} = \frac{kT}{q}\ln\left(\frac{N_A N_D}{n_i^2}\right)$$

where k=Boltzman constant, T=absolute temperature, q=elementary charge, $N_A$ and $N_D$ are the concentrations of the acceptor and donor impurity concentrations in the p+ and n+ areas respectively, and $n_i$ is the intrinsic carrier density of silicon. For typical values of $N_A$=5e17/cm3 (p+) and $N_D$=5e14/cm3, and an intrinsic carrier density $n_i$ of 1.2e10/cm3 at 300K, this built-in potential barrier is 1.2V, which is significantly higher than the 134 mV obtained by the p-well/p homojunction in FIG. 2. This potential barrier serves, in use, to shield the charge storage node from the active detector layer 1.

The surface p+ implant 4 is used to form a depletion region in the n-type photodiode 3 that depletes the diode entirely. At the bottom, the P++ bulk substrate 6 is used to deplete the n-epi layer 1. The depletion region from the top and from the bottom touch one another and then the structure is entirely depleted. A third depletion region is formed by the p-well 2/n-epi layer 1 junction. That also depletes the part of the n-epi layer 1 under the p-well 2. The potential in the n-epi area located under the p-well 2 will be lower than in the n-epi area under the photodiode, directing the electrons towards the photodiode.

Figure 5:
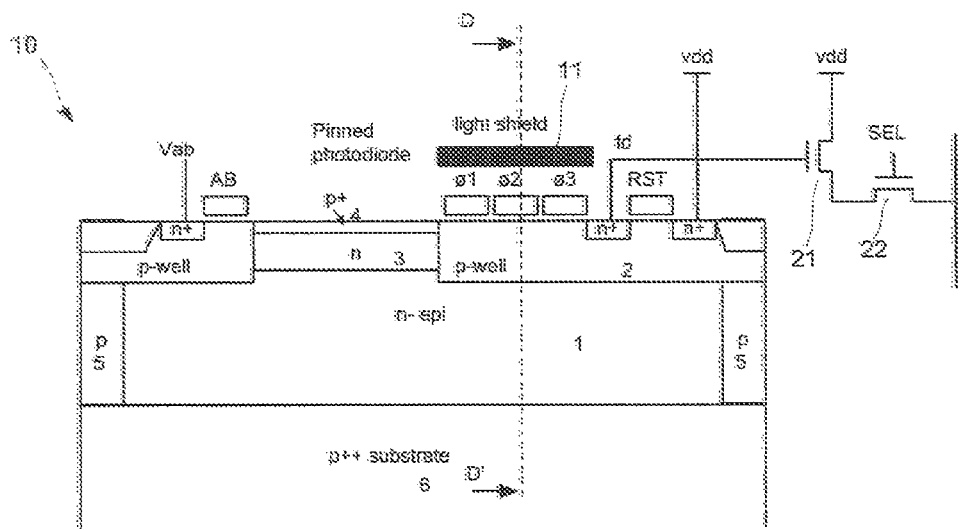
FIG. 5 shows a second embodiment of the present invention, with lateral isolation of a region extending to the p++ substrate.

The n-epitaxial region 1 forms a junction with the p region 2 above the n-epitaxial layer. It also forms a junction with the p++ bulk wafer 6, if present. Both junctions form a depletion region. It is preferred, but not essentially required, that the n-epitaxial layer 1 under the p-well region 2 is fully depleted. When the photodiode collects more electrons, the voltage on the photodiode drops. At a certain moment the potential on the photodiode is low enough so that additional charges will flow also in the n-epi part 1 under the p-well 2. Without any precautions, the charge can flow freely to the neighbouring pixels. Advantageously, this condition should be avoided. This condition can be avoided by providing deep p-type isolation implants 5 at the perimeter of the pixel. The isolation implants 5 form a potential barrier which prevents lateral diffusion of photo-electrons to the neighbouring pixels. The p-type isolation implant 5 may be connected to the bulk p+ layer as shown in FIG. 5, or it may not be physically connected, as shown in FIG. 4. If it is not physically connected, it will still form an isolation due to the full depletion of the n-epi layer 1 under the p implant region 5, which remains depleted at a lower potential than in the rest of the epitaxial layer.

An additional advantage of the pixel structure is that it is easier for charges generated inside the p-well region 2 to diffuse out of that region and into the photodiode. With the structure shown in FIG. 2, this path is much less likely, because of the much weaker electric field in that direction.

It is possible to provide a light shield 11 on top of the storage gate ø2, as shown in FIG. 5. Alternatively, the light shield 11 may be omitted, as shown in FIG. 4. An advantage of omitting the light shield 11 is that more photocharges will be generated in the pixel and, as described above, even charges generated in the p-well region may contribute to the charge integrated on the photodiode.

Global shutter pixels with in-pixel charge domain storage of the photosignal on a storage node need a low sensitivity of the storage node to light. This parameter is quantitatively measured as parasitic light sensitivity or shutter efficiency. The parasitic light sensitivity of the storage node reflects the sensitivity of the storage node to light. If an image is exposed during an exposure time $T_{exp}$, and then stored during a storage time $T_{store}$ on an in-pixel storage node, with a constant light level, then for an ideal global shutter pixel the output signal of the pixel should be proportional to $T_{exp}$ and invariable when $T_{store}$ is increased. In reality, the output signal of the pixel will also be sensitive to the storage time $T_{store}$. The output signal $S_{pix}$ measured at the pixel output under a constant light level is given by the following equation $$S_{pix}=aT_{exp}+bT_{store}$$

in where parameters a and b are proportional to the light level and the light sensitivity of the photodiode and the storage node respectively. The ratio b/a between these two factors is called the parasitic light sensitivity (PLS). Sometimes, this property is characterised by the shutter efficiency, given by the equation:

$$\eta_{shutter} = \left(1 - \frac{1}{PLS}\right)$$

Figure 10:
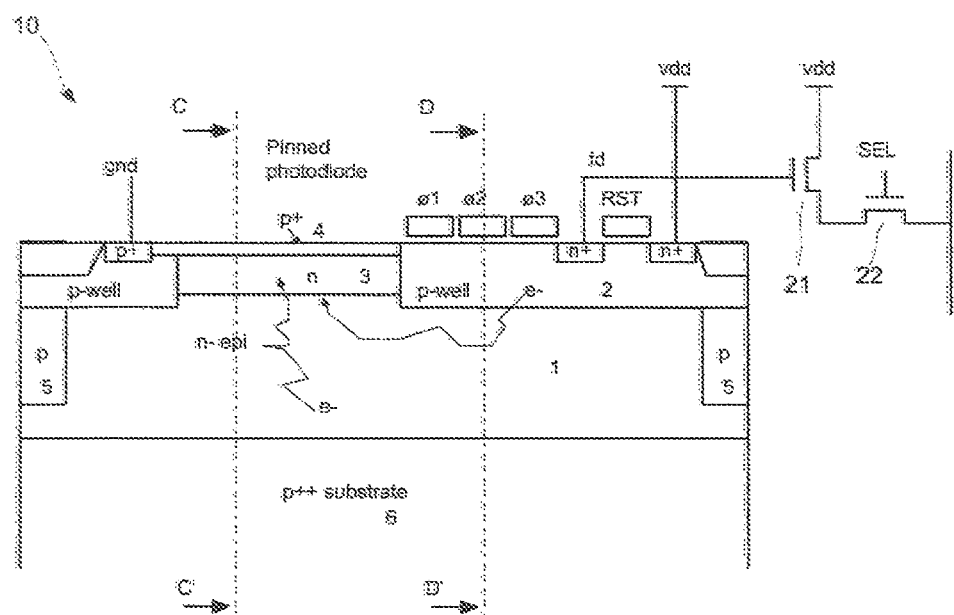
FIG. 10 shows another embodiment of the present invention, without lateral anti-blooming transistor.

When the pixel is fully saturated, the potential well created by the junction profiles becomes fully filled with electrons. The excess electrons have to be drained away. There are several possible directions to which these electrons can flow. It is undesirable that these electrons reach the charge storage node ø2. Also, it is undesirable that these charges should flow to neighbour pixels since that causes a blooming effect. This effect is visible as a fast and wide increase of white spots at strongly overexposed pixels. Advantageously, some anti-blooming measures are provided in the pixel. In FIGS. 4 and 5 a lateral anti-blooming transistor AB is shown. The drain of the anti-bloom transistor is connected to a DC voltage Vab, typically equal to Vdd. The gate of the anti-bloom transistor AB is connected to a low DC potential. This potential is typically higher than the potential on ø1 applied during the exposure time, to avoid that charges are moved into the storage gate ø2. Instead of different gate bias levels, this can also be realized by different threshold voltages on the ab gate and the ø1 gate. When the photodiode is filled with electrons, the excess electrons are drained away through this anti-blooming transistor to the Vab drain, which is typically the supply. This anti-blooming transistor consumes surface area of the pixel and it may be desired to avoid the use of an anti-bloom transistor. There are other possible escape paths for the electrons in a saturated photodiode. Firstly, the charges may flow vertically to the p++ bulk wafer 6. Alternatively, the charges can be drained away laterally into the p-type isolation implants 5. Both charge drains are possible only if it is provided that the charge does not flow underneath the gate ø1. This can be realised by biasing gate ø1 at a low potential, which can possibly be a negative potential such as −1V. When strongly biased negative, this gate may be operated in accumulation, forming a hole accumulation layer under the gate. This has the additional advantage that the dark current contribution under this gate is avoided. Electrons generated at the silicon surface under this gate will recombine immediately with the holes accumulated under this gate. Instead of a negative potential, it is also possible to increase the threshold voltage of the transfer gate by the dopant type of the gate material (e.g. a p-doped gate). A pixel structure without anti-bloom transistor is shown in FIG. 10.

Figure 7:
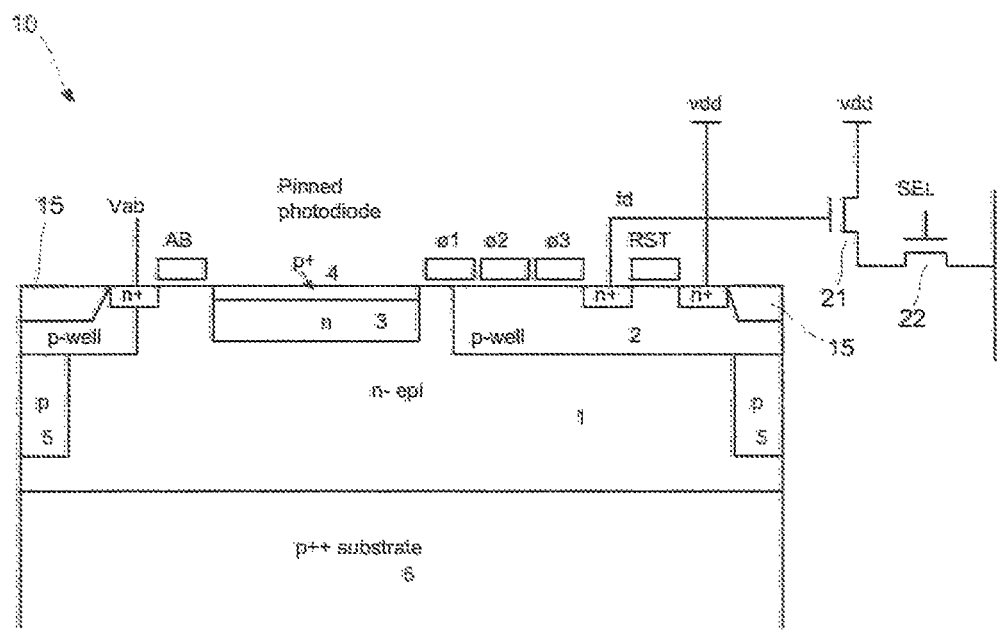
FIG. 7 shows another embodiment of the present invention, with the p-well storage node isolation implant extending only partially under the first transfer gate.
Figure 8:
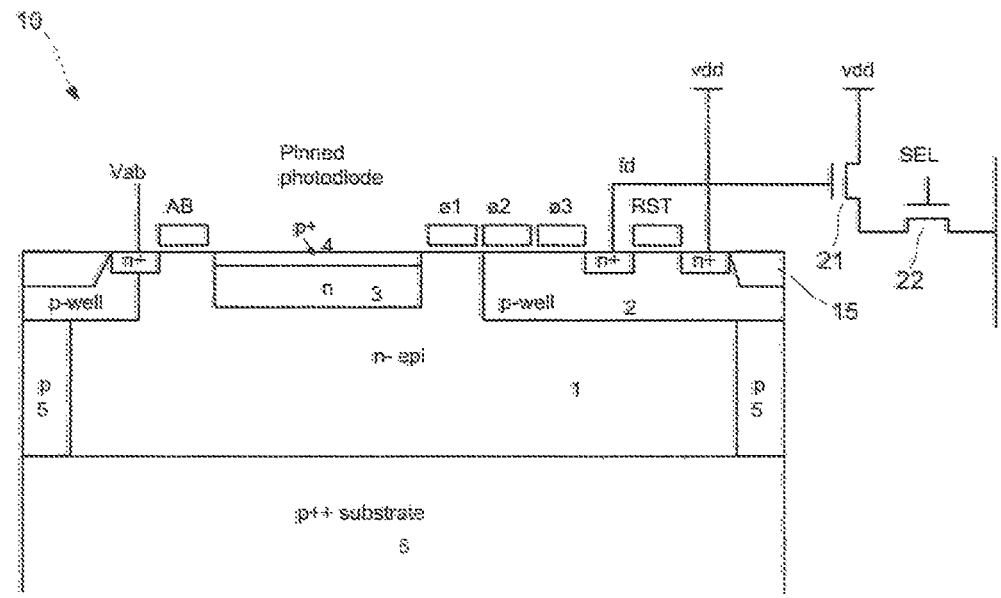
FIG. 8 shows another embodiment of the present invention, with the p-well storage node isolation implant extending only under the storage gate and the last transfer gate.
Figure 9:
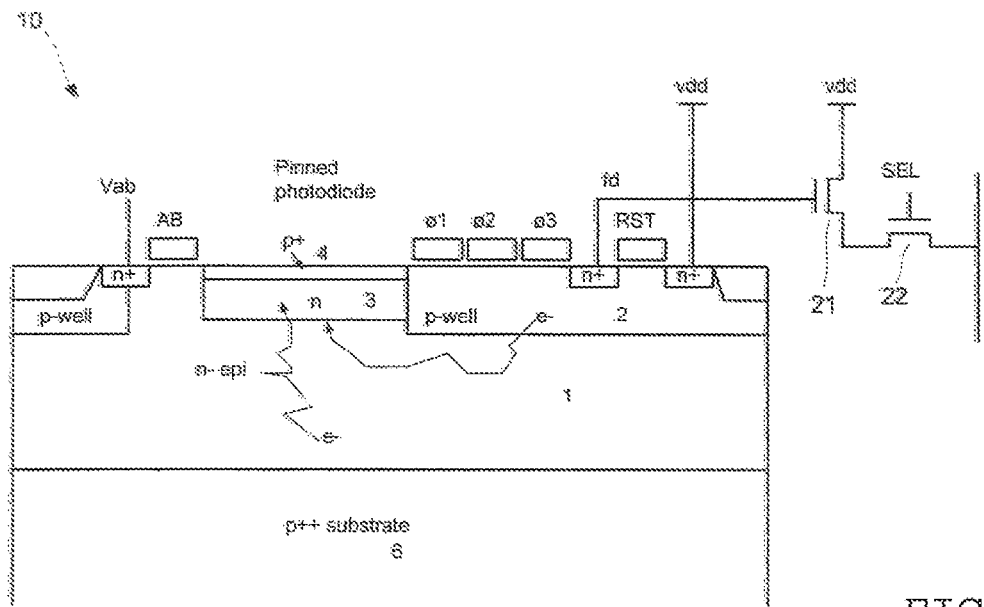
FIG. 9 shows another embodiment of the present invention, without deep lateral p isolation implants.

In FIGS. 4 and 5 the p-well region 2 is present under the charge storage node ø2, and the p-well region 2 extends up to the photodiode regions 3, 4. In alternative embodiments, the p-well region 2 may only extend beneath the charge storage node ø2. The extent to which the p-well region 2 extends can depend on the characteristics of the transfer gate ø1. When the p-well extends fully under gate ø1 to the photodiode, the side of the photodiode may remain depleted even when gate ø1 is operated. This may fully, or partially, block the charge transfer. FIG. 7 shows a p-well region 2 partially extending under gate ø1. FIG. 8 shows a p-well region 2 that is not extended under gate ø1, but only present under the storage gate ø2 and the transfer gate ø3. The p-well region 2 is also present under the floating diffusion (fd) to isolate this n+ junction from the n-epi. A p-well of the same, or different, concentration as region 2 can also be present under the reset transistor, the source follower 21 and the selection transistor 22 of the pixel.

Figure 11:
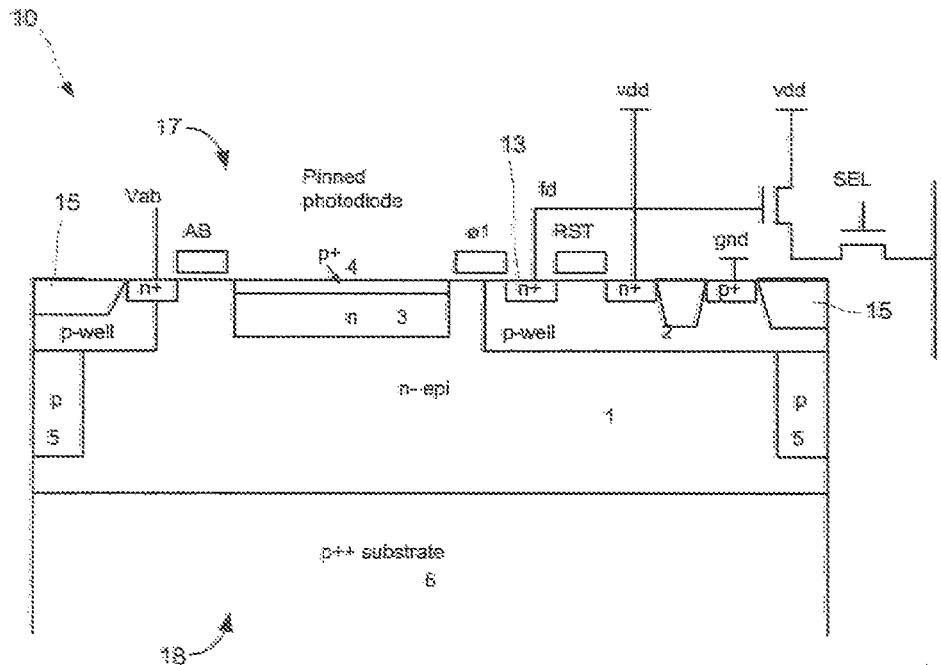
FIG. 11 shows another embodiment of the present invention, on a global shutter pixel that stores the photosignal directly on the floating diffusion, and where the floating diffusion is isolated by a p-well isolation implant.
Figure 12:
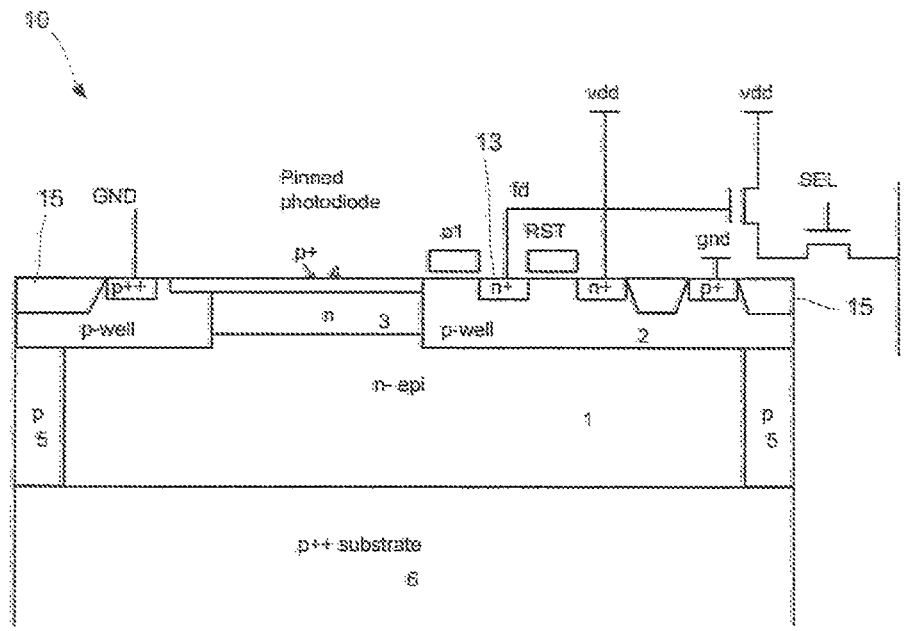
FIG. 12 shows an embodiment similar to FIG. 11, but without lateral anti-blooming transistor and with a deep lateral p isolation implant that reaches the p++ substrate.

FIGS. 11 and 12 shows how this isolation technique can be used for five-transistor (5T) pixels. These pixels can be operated in a rolling shutter mode or in a global shutter mode. In both modes of operation the charge-to-voltage conversion element (floating diffusion fd, 13) also serves as the charge storage node. Firstly, global shutter operation will be described. The n+ floating diffusion implant 13 is used to store the photosignal in global shutter operation. Charges are moved synchronously in all pixels of the pixel array from the pinned photodiode to the floating diffusion fd 13 at the end of the exposure time. Then, the signals sampled on the floating diffusion fd 13 are read out sequentially, row-by-row. The signals stay sampled on the floating diffusion 13 until the pixel is read out. Secondly, rolling shutter mode will be described. At the end of the exposure time, charges are moved from the pinned photodiode to the floating diffusion fd 13. Then, the signal sampled on the floating diffusion fd 13 is read out. Pixels are read out on a row-by-row basis. The time period for which signals are sampled on the floating diffusion 13 is minimal. During exposure, charges that are generated under the p-well 2 are immediately drained to the photodiode rather than being collected by unrelated n+ junctions in the pixel. Charges generated in the p-well 2 may escape to the n-epi and contribute to the photosignal, rather than being captured by an unrelated n+ junction.

The floating diffusion/charge storage node fd has to be shielded from parasitic light and from photogenerated carriers diffusing in the substrate. Embodiments provide an improved shielding of the storage node from parasitic light. The anti-blooming transistor, shown in FIG. 11, is optional again, and can be replaced by vertical or lateral anti-blooming by draining excess charges to the p+ bulk wafer or the p isolation regions 5. In that case a simpler 4-transistor pixel configuration is obtained, as shown in FIG. 12. Another difference between FIGS. 11 and 12 is the extension of the p-well under the transfer gate ø1. In FIG. 11 it extends fully until the pinned photodiode, while in FIG. 12 it is only partially under the transfer gate ø1. The best configuration depends on the charge transfer characteristics of ø1, which depend on their turn on the implant concentrations and electrical fields in the structure.

Figure 13:
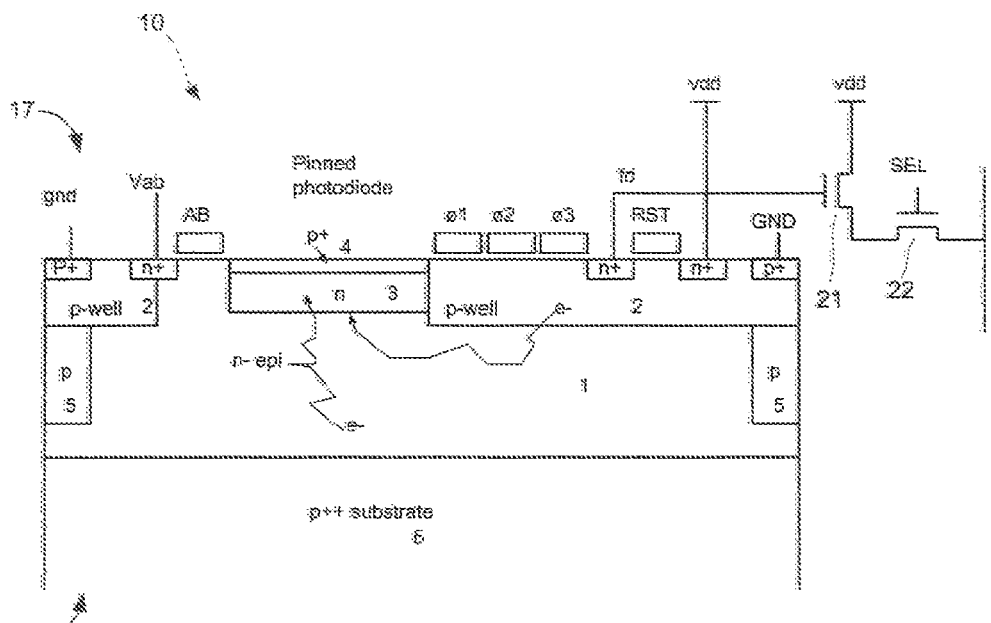
FIG. 13 shows a pixel structure similar to FIG. 4 but without shallow trench isolation.

In the FIGS. 4, 5, 7-12, the n+ and p+ implant regions are isolated also by shallow trench isolation (STI) 15. Trenches 15 filled with oxide or another dielectric are used to isolate the different junctions within, and between, the pixels. Instead of STI, this isolation can also be offered by the p-well implant and p+ surface layers as shown in FIG. 13. The n+ layers are separated inside the p-well area. The p-well is connected with p+ areas to ground. The depletion region around each n+ diffusion extends into the p-well but the distance between neighbour n+ implants is sufficiently wide to provide good isolation between the regions. A typical width is similar to the minimum gate width of the transistors in the used technology. This offers a more planar structure, which reduces the dark current and distribution of dark current along different pixels. It may also reduce the hot pixel count. The boron p+ regions that are used for isolation can act as effective gettering centres to collect foreign contaminants in the epitaxial layer, such as certain metallic ions. Some metal ions have a preference to be collected by boron implanted regions.

Figure 14:
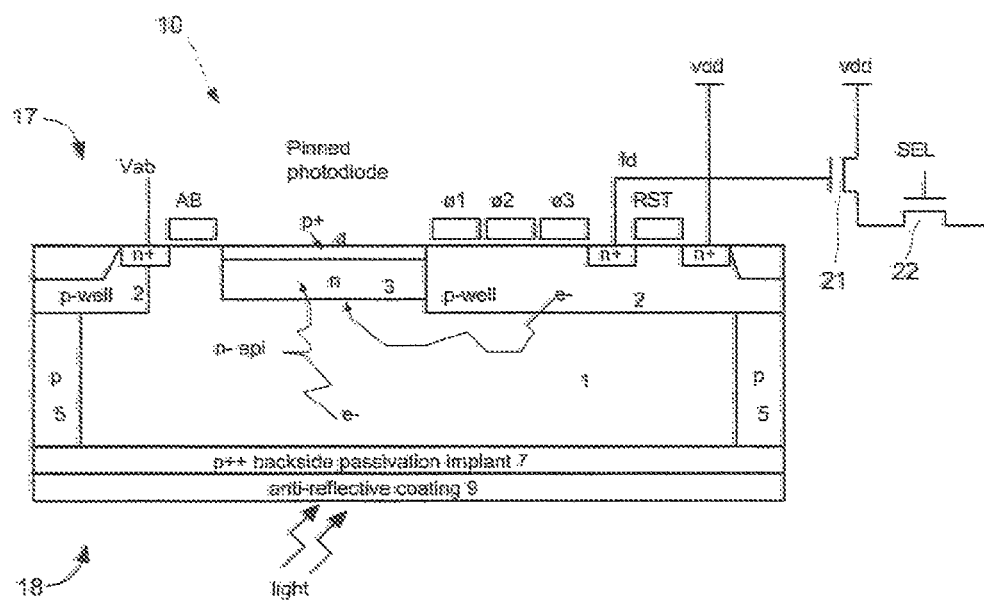
FIG. 14 shows an embodiment of the present invention used on a thinned image sensor with backside illumination.
Figure 15:
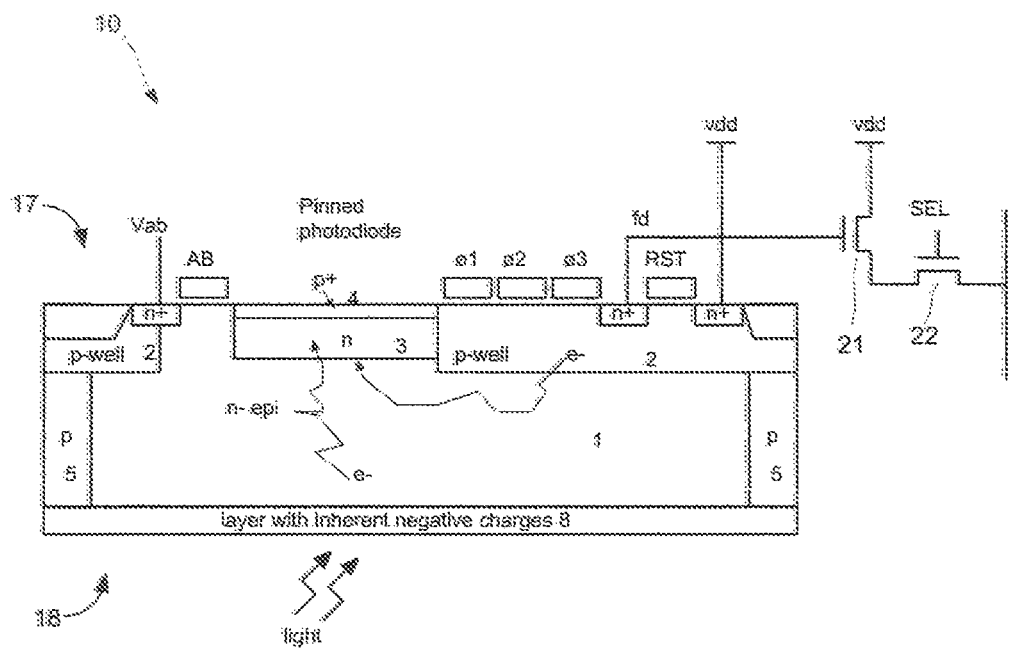
FIG. 15 shows another embodiment of the present inventions with backside illumination and a different backside passivation technique.

Embodiments can be applied to backside illuminated image sensors. A backside illuminated image sensor is illuminated from an opposite face of the image sensor to the face where the gates are formed. FIG. 14 shows a backside illuminated image sensor, with gates formed on the upper face of the image sensor. The image sensor is illuminated from the lower face. The p++ substrate layer 6 is not present and is replaced by a shallow p++ implant layer 7. This p++ implant layer 7 can be realised, for example, by a shallow implantation that is activated by a laser anneal step, as known in the field. The p++ layer 7 creates the backside ground potential and passivates the backside surface. On top of the backside silicon layer, an anti-reflective coating 9 may be applied to increase the light coupling into the silicon. FIG. 15 shows an alternative implementation with a layer 8 with fixed negative charges, such as Al2O3 (Aluminium Oxide) or a thin layer of HfO (Hafnium Oxide). Such layer will attract holes that form a hole accumulation layer near the back surface. This layer also effectively passivates the backside and creates the right electric field. This passivation technique is further described in U.S. Pat. No. 8,283,195. The form of isolation of the storage node against electrons diffusing in the epitaxial layer described in this invention allows to create global shutter pixels with backside illumination and a good shutter efficiency. This is not possible in a backside illuminated pixel when no isolation technique is used, or when a light shield is used to cover the storage nodes, or when a simple concentration difference of the same conductivity type is used.

Putting a light shield on backside illuminated image sensors is a complex extra processing step, which also reduces the fill factor and the light sensitivity of the pixel. Also, most of the photo-electrons are generated close to the silicon backside surface and have to diffuse to the photodiode. Diffusion to the storage nodes is more likely in case of such backside illuminated sensor. In embodiments, a charge storage node is effectively shielded from light, without the use of a backside light shield.

Figure 16:
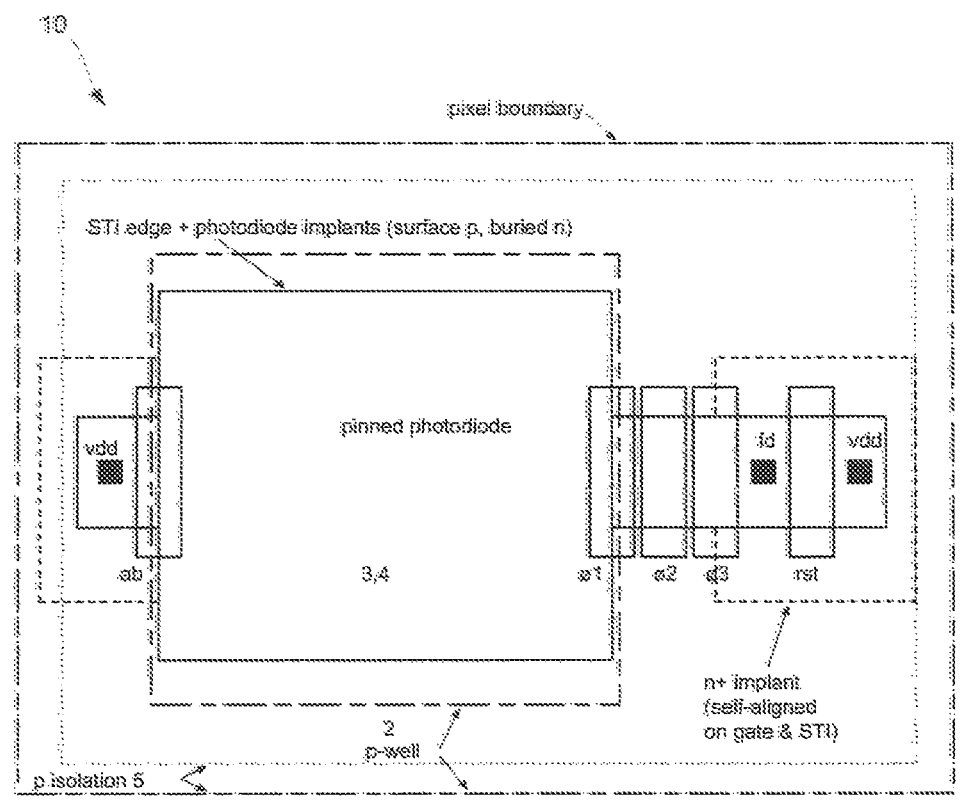
FIG. 16 shows a top view layout of the pixel of FIG. 4.

FIG. 16 shows a top view of the mask layout of a pixel structure of the type shown in FIGS. 4-10 and 13-15. The STI mask is shown in solid lines. STI is present everywhere except on the pinned photodiodes and transistors (also called the "active area" of the structure). Several of the implants are aligned on the STI. The polysilicon gates ø1, ø2, ø3, RST and ab are also shown. The n+ implant mask aligns on the polysilicon gates and the STI and implants the floating diffusion and vdd contacts. The pinned photodiode is formed by p+ surface implants and deeper n implants which may or may not be aligned to the STI and/or the polysilicon gates. The p-well mask defines the area of the p-well implant. The p-well has to be present at least under the storage node (ø2 in this case). It is also typically required under the transistor gates of the pixel (reset gate, source follower, select transistor). It may, or may not, be partially present under the first transfer gate and the anti-blooming gate. The deeper p-isolation implant is defined by a strip along the edge of the pixel, and forms an effective isolation between neighbour pixels.

Figure 17:
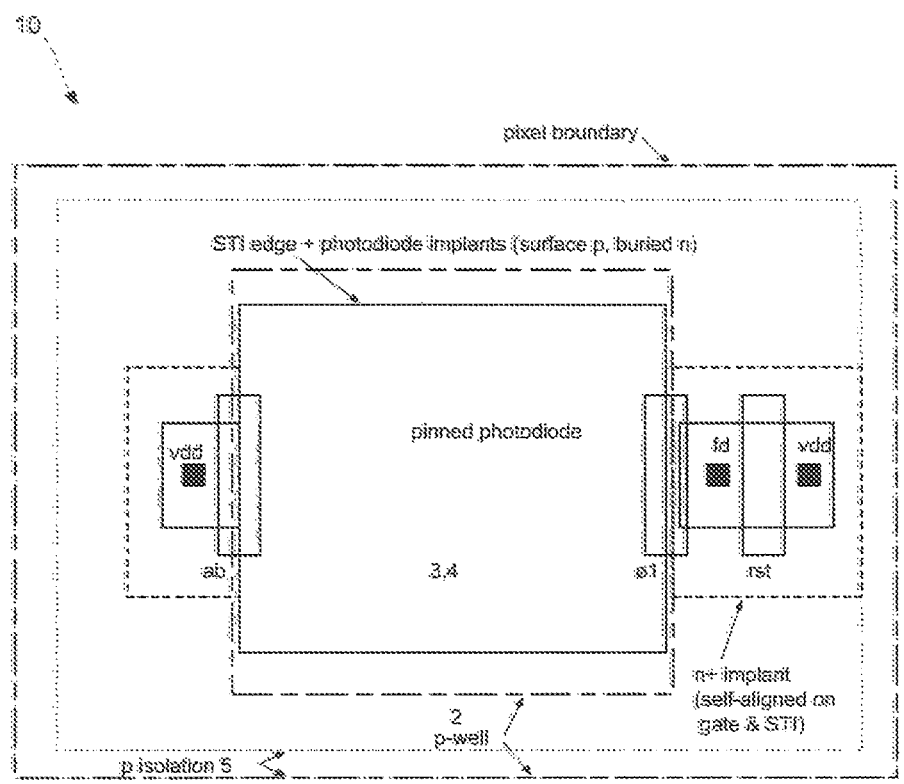
FIG. 17 shows a top view layout of the pixel of FIG. 12.

FIG. 17 shows a top view of a pixel structure of the type shown in FIGS. 11 and 12. Similar masks are used as in FIG. 16. The floating diffusion is located within the p-well, since this node is used to store the photocharges after exposure.

Figure 18:
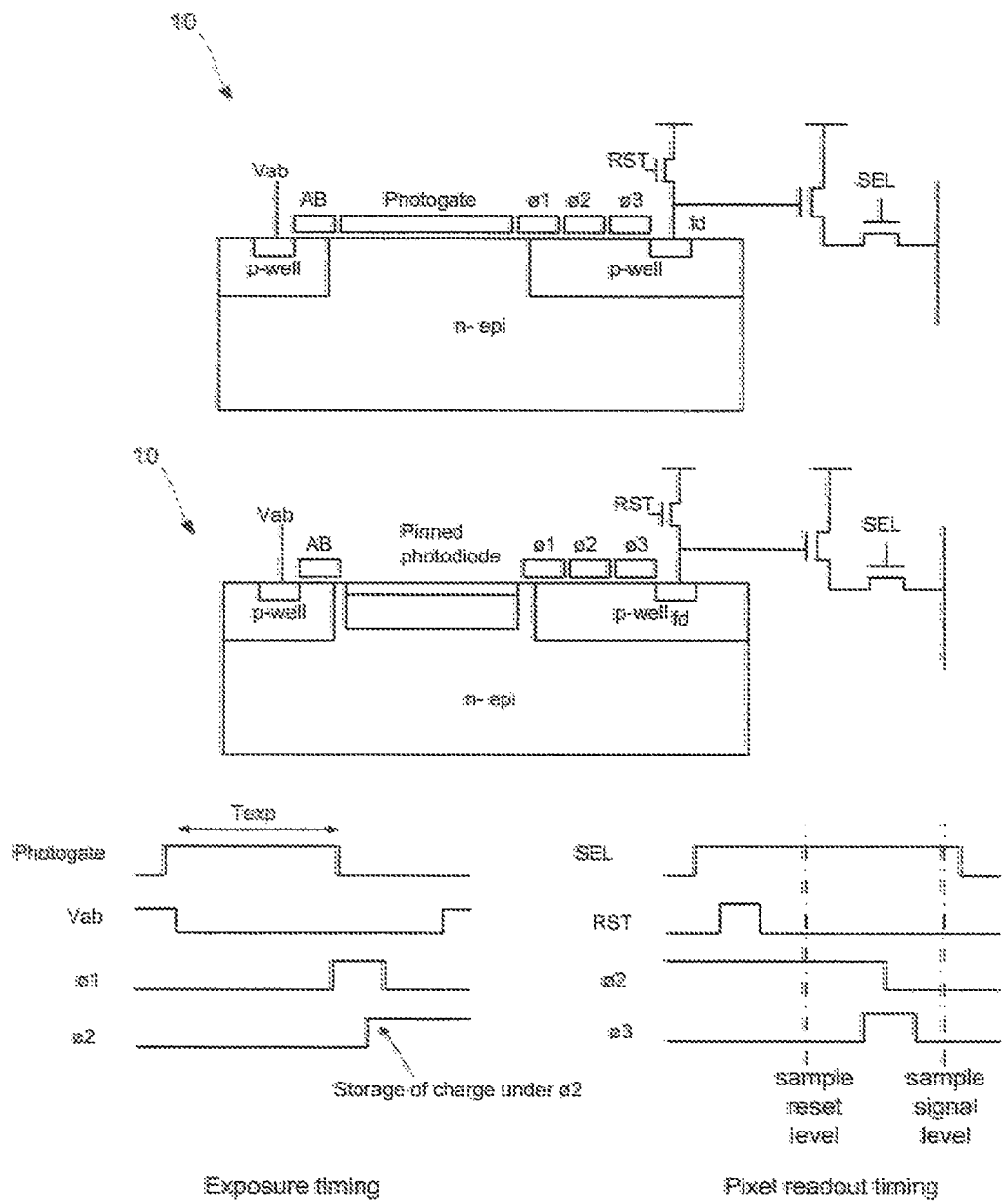
FIG. 18 shows exposure and readout timing for a pixel.

FIG. 18 shows two pixel structures: a first pixel structure with a photogate as a photo-sensitive element, instead of a pinned photodiode; and a second pixel structure which is the same as previously shown in FIG. 7. A timing scheme for operation of the pixels structures is also shown. Vab is pulsed to an intermediate level during the exposure, sufficiently higher than the low level on ø1 but still low enough to keep charge stored in the photogate or photodiode. During readout, Vab can be pulsed to a low level as shown in the timing diagram. Alternatively, it can remain at a fixed potential, higher than the low level of ø1. The photogate signal is only used in case of a pixel using a photogate as charge collecting element. It is not applied in case of a pixel with a pinned photodiode.

Figure 19:
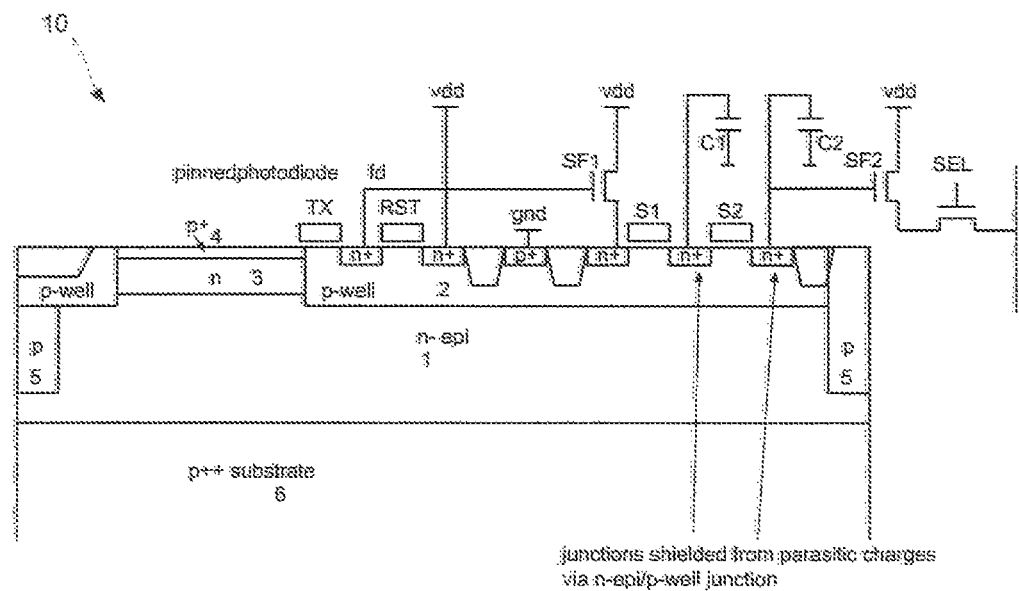
FIG. 19 shows a pixel structure with storage capacitors.
Figure 19:
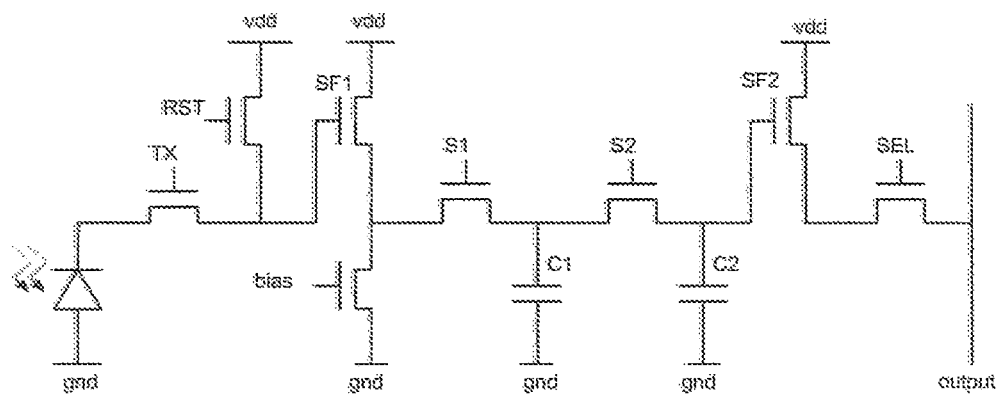

FIG. 19 shows a pixel structure which is suitable for global shutter operation. It can store a signal value on each of C1 and C2. In use, the pixel can store a reset value on capacitor C2 and a signal value on capacitor C1. A pixel structure of this type is described in EP 2 109 306. A gate can be used to store a signal value instead of a capacitor. The gate or capacitor is not itself collecting any charges, but there is a switch connected to this capacitor, such as switches S1 and S2 shown in FIG. 19. Such a switch comprises a small n+ source/drain area which can still collect photocharges. In embodiments, these n+ junctions are shielded from parasitic charges that diffuse in the epitaxial layer, in the same way as a charge storage node is shielded in the pixels described earlier. The potential difference between the p-well and the underlying n-epitaxial layer ensures that electrons diffuse into the n-epitaxial layer and that electrons in the epitaxial layer will not diffuse upwards to the p-well and further to the n+ junctions of switches S1 and S2. This further improves the parasitic light sensitivity further for this pixel with embedded capacitors. The principle can also be applied to other pixel topologies described in more detail in EP 2 109 306, such as pixels using a single in-pixel storage capacitor, or two capacitors in parallel.

In these embodiments there is a charge storage element which comprises the capacitor C1 (or C2) and the parasitic capacitances tied to that node. The capacitor C1 or C2 is either a metal-metal capacitor, or the gate-to-channel capacitance of a transistor. In latter case, the channel is tied to ground. The gate is not capable of collecting any photocarriers, so the capacitor itself is not light sensitive. The parasitic capacitances include metal routing (interconnect, not collecting any charges) and junctions of switches that are connected to the capacitors. These junctions are the n+ source/drain areas of switch S2 and the n+ drain of switch S1 in case of FIG. 19. These junctions are capable of collecting electrons from the underlying substrate and benefit from shielding. Although these junctions are not the main place where charge from an exposure is stored, they form part of a flow path to a charge storage element and are capable of storing charge. These junctions can be considered as charge storage nodes which form part of a charge storage element.

Figure 20:
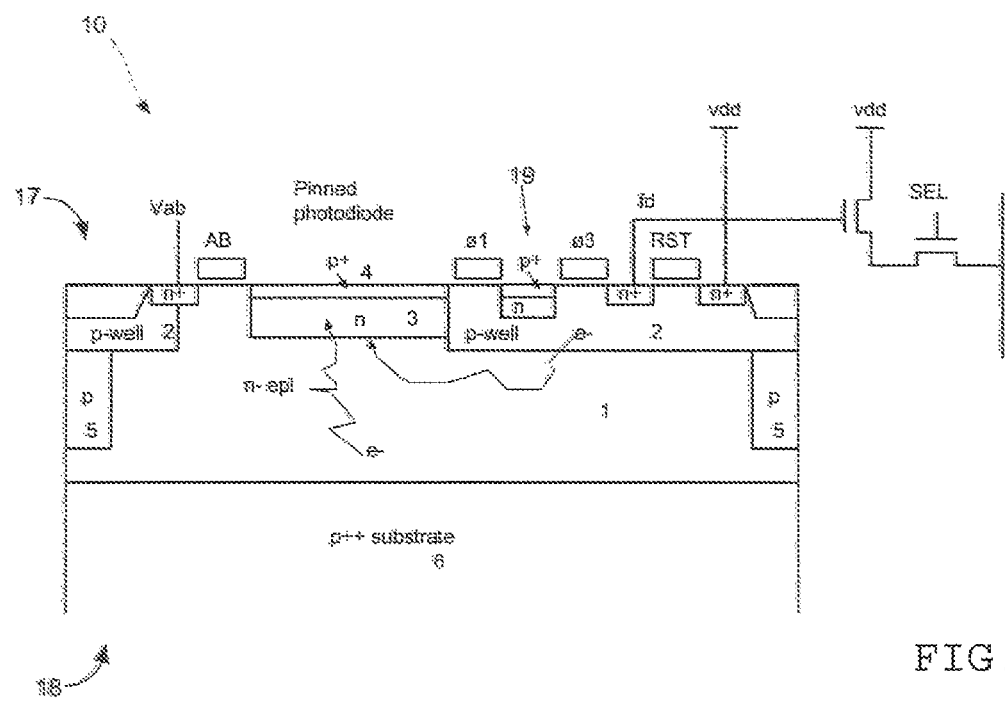
FIG. 20 shows a pixel structure with a second pinned photodiode as the charge storage node.

FIG. 20 shows a pinned diode 19 used as a charge storage node. The pinned diode is positioned between a transfer gate ø1 and a transfer gate ø3. This pinned diode 18 is fully depleted at a higher potential than the pinned photodiode formed by regions 4 and 3. When ø1 is enabled, all charge will flow from the pinned photodiode to the pinned diode 19 due to the potential difference between both photodiodes. The pinned diode 19 should also be protected against charges diffusing in the epitaxial layer. Again, the p-well/n-epi layer forms a barrier against such charge diffusion.

For any of the embodiments described above, example dopant levels can be:

region 1: epilayer n-type 5e14/cm3 or lower;

region 2: p-well. around 1e17/cm3-1e18/cm3. Substantially higher than the n-type epi layer, but lower than the n+ surface implants that form transistor source/drain junctions (the n+ surface mosfet source/drain implants).

region 3: photodiode n-layer. Between 5e16/cm3 and 1e18/cm3;

region 4: photodiode surface p+ layer. Substantially higher than region 3, 1e18/cm3 to 5e19/cm3;

region 5: p isolation layer. Similar to the p-well, around 1e17/cm3 to 1e18/cm3.

region 6: p++ substrate (if present): highly doped, similar to region 4 or higher p-well surface contact (p+, FIGS. 11, 12): around 5e19/cm3, similar to the n+ mosfet source/drain surface implants.

An array of the pixel structures described above can be operated with a rolling shutter function or a global shutter function. For a global shutter function, there is a requirement to store a signal within the pixel structure for a longer period of time, and therefore a greater need for low sensitivity of the storage node to light. Control logic is arranged to cause the array of pixel structures to be exposed synchronously. The control logic can also arranged to read a voltage signal from the pixel structures in the array for a first exposure period while the pixel structures are exposed for a second exposure period. Alternatively, all of the pixels may be read before starting to expose pixels for the next exposure period. One signal, or two signals (reset and signal) may be read from each pixel during readout.

Pixel structures described above can be operated with noise-free storage if the photocharges are transferred to the storage node, and remain in the charge domain. The pixel structure can be implemented by a small 3-phase in-pixel charge coupled device, such as described in S. Lauxtermann, et al, "Comparison of Global Shutter Pixels for CMOS Image Sensors", proc. International Image Sensor Workshop 2007, Ogunquit, Me., Jun. 6-10, 2007 (available on www.imagesensors.org) and in U.S. Pat. No. 7,271,835. This publication shows a succession of 3 transfer gates coupled to a pinned photodiode. The centre transfer gate is used as a storage node to store the photocharges and is called the storage gate. After the exposure, the charges are transferred from the pinned photodiode to the center storage gate via a first transfer gate connected between both. For readout of the pixel, the floating diffusion sense node is first reset, and this reset level is sampled by the readout electronics (in a column amplifier or output amplifier). Then the charge is transferred from the storage gate through the third transfer gate to the sense node. The voltage on the sense node changes and the new voltage is sampled again. The difference between both samples is a measure of the photocharges, free of kTC reset noise of the sense node (fd).

An alternative form of the storage node is a pinned diode, as shown in FIG. 20. A pixel structure of this type is described in H-J. Yoon, et al, "A CMOS Image Sensor With In-Pixel Two-Stage Charge Transfer for Fluorescence Lifetime Imaging", IEEE trans. El. Dev, Vol. 56, No. 2, February 2009. The storage node is a pinned photodiode which is now at a fixed potential when the photodiode is depleted. This fixed potential is higher than the potential of the photodiode when it is depleted (also called the "pinning voltage"). The transfer gate between the pinned photodiode and the storage node moves the charge packet entirely to the storage node synchronously in all pixels after image capture. The transfer gate between the storage node and the floating diffusion moves the charge to the sense node for readout, with the same CDS scheme as in the documents cited above. This structure with two transfer gates and a pinned storage node can be considered as a 3-phase CCD with a virtual phase in the center.

Figure 21:
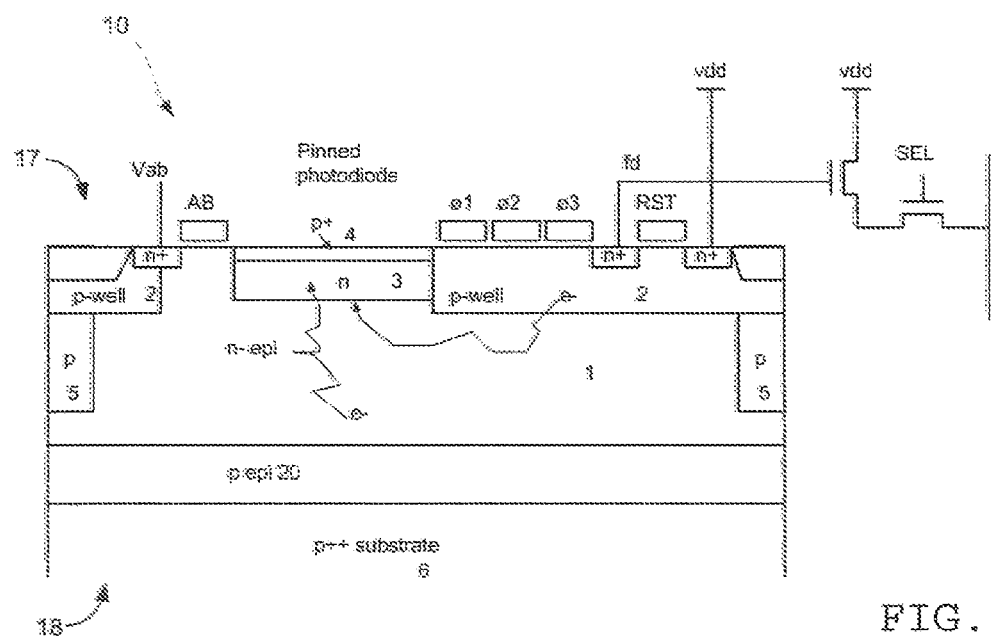
FIG. 21 shows a pixel structure with a further epitaxial layer between the epitaxial layer of the first conductivity type and the substrate of the second conductivity type.

FIG. 21 shows a pixel structure similar to FIG. 4, but where the p-type substrate comprises two layers: a thick p++ substrate layer 6 and a p-type epitaxial layer 20. An advantage of the structure of FIG. 21 is a better junction quality of the buried p/n junction, with lower recombination losses. The p-type epitaxial layer 20 keeps the buried p/n junction away from the p++ substrate 6. The p++ substrate is typically formed by Czochralski (CZ) growth, which may be of lesser quality than the p-type layer 20 which is formed by epitaxial growth. The concentration of the p-type epitaxial layer 20 is sufficiently high to deplete the n-type epi layer 1 from the bottom side. The use of an epitaxial layer 20 of the second conductivity type (p-type) can be applied to any of the embodiments where a substrate 6 is provided.

Figure 22:
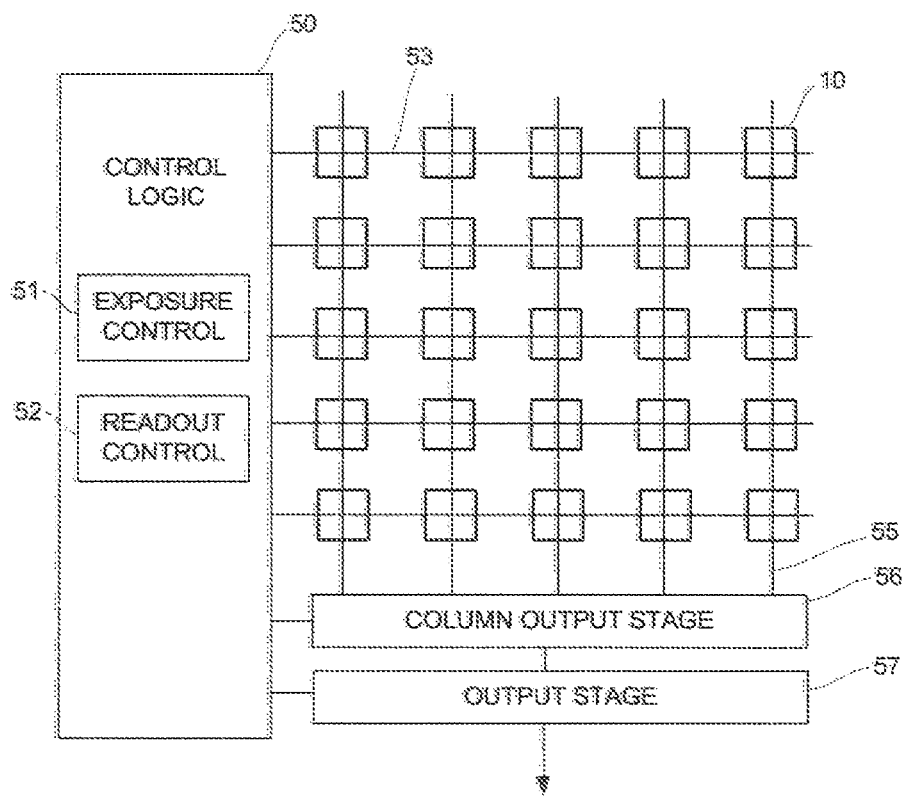
FIG. 22 shows a pixel array comprising any of the pixel structures described in earlier Figures.

FIG. 22 shows an image sensor comprising an array of pixel structures 10 of any of the types described above. Control logic 50 controls operation of the pixel array and output stages 56, 57. Control logic 50 comprises logic 51 for controlling exposure of pixels 10 and logic 52 for controlling readout of pixels. Exposure control logic 51 can comprise line driver circuitry for generating control signals on control lines 53. Readout control logic 52 can comprise row selection/line driver circuitry for generating control signals on control lines 53 to control readout of pixels 10. Control logic 50 can control: resetting of the pixels to control the start of an exposure period (including operation of transfer gates and reset switch via control signal RST); operation of transfer gates to transfer charges to the charge storage node and/or floating diffusion fd; operation of switch 22 by a control signal SEL to control read-out from a pixel.

Example timing schemes for the control signals have been shown, and are known to a person skilled in the art. The pixel array can be read out in a conventional manner, with pixels being scanned on a row-by-row basis. Alternatively, control logic 50 can perform a global shutter function by synchronising operation of the control signals which control respective exposure times of each of the pixels of the array. The control logic 50 can be stored in hard-coded form, such as in an Application Specific Integrated Circuit, or it can be stored in some form of reconfigurable processing apparatus, such as a logic array (programmable array, reconfigurable array) or a general-purpose processor which executes control software. All of the elements shown in FIG. 21 can be provided on a single semiconductor device or the elements can be distributed among several separate devices. Column output stage 56 can comprise column processing circuitry dedicated to each column, such as: an analog-to-digital converter (ADC), one or more amplifiers, storage to store values in order to perform features such as correlated double sampling (CDS). An output stage 57 can perform further processing of the signals received from columns of the array.

Embodiments can also be applied to pixels that use multiple storage nodes to store the signals of multiple exposures into a pixel. These pixels acquire a burst of n images, which are sampled successively in n memory elements in the pixel. Each of the memory elements is composed of structures such as described in this application, such as capacitors, storage gates or floating diffusions. After the image acquisition burst, the n memory elements are read out. Also in this case it is essential to store the memory elements from light.

Embodiments shown in the drawings and described above have the first conductivity type as n-type and the second conductivity type as p-type. It is also possible to have the first conductivity type as p-type and the second conductivity type as n-type. The pixel structure will comprise a p-type epitaxial layer 1, an n-well implant 2 to shield the charge storage node and a pinned photodiode comprising a deep p implant (region 3) with a surface n+/n++ implant (region 4).

Although the photo-sensitive element (pinned photodiode) shown in the embodiments is connected to a single transfer gate, there can be two or more transfer gates connected to the photo-sensitive element, as described in EP 2 346 079 A1 and US2012/002089A1. Each of the charge storage nodes and/or charge-to-voltage conversion elements can be shielded in the manner described above.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. A pixel structure comprising:
an epitaxial layer of a first conductivity type;
a photo-sensitive element comprising a first region of a second conductivity type and a second region of the first conductivity type positioned between the epitaxial layer and the first region;
a charge storage node which is arranged to store charges acquired by the photo-sensitive element, or to form part of a charge storage element;
a third region of the second conductivity type positioned between the charge storage node and the epitaxial layer;
a charge-to-voltage conversion element for converting charges from the charge storage node to a voltage signal; and,
an output circuit for selectively outputting the voltage signal from the pixel structure;
isolation regions of the second conductivity type, different from the first conductivity type, adjacent a boundary of the pixel structure for preventing lateral diffusion of charges, wherein the isolation regions are located in the epitaxial layer.

2. A pixel structure comprising:
an epitaxial layer of a first conductivity type;
a photo-sensitive element comprising a first region of a second conductivity type and a second region of the first conductivity type positioned between the epitaxial layer and the first region;
a charge storage node which is arranged to store charges acquired by the photo-sensitive element, or to form part of a charge storage element;
wherein the charge storage node comprises a pinned diode;
a third region which comprises only the second conductivity type positioned between the charge storage node and the epitaxial layer;
a charge-to-voltage conversion element for converting charges from the charge storage node to a voltage signal; and,
an output circuit for selectively outputting the voltage signal from the pixel structure.

3. A pixel structure comprising:
an epitaxial layer of a first conductivity type;
a photo-sensitive element comprising a first region of a second conductivity type and a second region of the first conductivity type positioned between the epitaxial layer and the first region;
a charge storage node which is arranged to store charges acquired by the photo-sensitive element, or to form part of a charge storage element;
wherein the charge storage node comprises a transfer gate;
a third region, which comprises only the second conductivity type, extending from the transfer gate to the epitaxial layer;
a charge-to-voltage conversion element for converting charges from the charge storage node to a voltage signal; and,
an output circuit for selectively outputting the voltage signal from the pixel structure.

4. A pixel structure according to any of claims 1-3 wherein the first conductivity type is n-type and the second conductivity type is p-type.

5. A pixel structure according to any of claims 1-3 wherein a dopant level of the third region is higher than a dopant level of the epitaxial layer.

6. A pixel structure according to claim 5 wherein a dopant level of the third region is higher than a dopant level of the epitaxial layer by a factor of at least 100.

7. A pixel structure according to any of claims 1-3 wherein a dopant level of the second region is higher than a dopant level of the epitaxial layer.

8. A pixel structure according to claim 7 wherein a dopant level of the second region is higher than a dopant level of the epitaxial layer by a factor of at least 100.

9. A pixel structure according to any of claims 1-3 wherein the charge-to-voltage conversion element is a region of the first conductivity type within the third region.

10. A pixel structure according to any of claims 1-3 wherein the charge storage node and the charge-to-voltage conversion element is a region of the first conductivity type within the third region.

11. A pixel structure according any of claims 1-3 wherein the charge storage node is positioned between the photo-sensitive element and the charge-to-voltage conversion element.

12. A pixel structure according to claim 11 further comprising at least one of:
a transfer gate positioned between the photo-sensitive element and the charge storage node;
a transfer gate positioned between the charge storage node and the charge-to-voltage conversion element.

13. A pixel structure according to any of claims 1-3 wherein the charge storage node is positioned between the charge-to-voltage conversion element and the output circuit.

14. A pixel structure according to any of claims 1-3 wherein the charge storage node is the charge-to-voltage conversion element.

15. A pixel structure according to any of claims 1-3 wherein the third region extends to the first region and the second region of the photo-sensitive element.

16. A pixel structure according to any of claims 2-3 further comprising isolation regions of the second conductivity type adjacent a boundary of the pixel structure for preventing lateral diffusion of charges, wherein the isolation regions are located in the epitaxial layer.

17. A pixel structure according to any of claims 1-3 further comprising a substrate of the second conductivity type.

18. A pixel structure according to claim 17 further comprising an epitaxial layer of the second conductivity type positioned between the epitaxial layer of the first conductivity type and the substrate.

19. An image sensor comprising an array of the pixel structures according to any of claims 1-3.

20. An image sensor according to claim 19 comprising a front side and a back side, wherein the photo-sensitive element and the charge storage node are positioned adjacent the front side, and wherein the image sensor is intended to be exposed to light on the back side.

21. An image sensor according to claim 20 and further comprising control logic which is arranged to cause the array of the pixel structures to be exposed synchronously.

* * * * *